(12) United States Patent
Kitagawa et al.

(10) Patent No.: US 6,631,071 B2
(45) Date of Patent: Oct. 7, 2003

(54) CAPACITOR MODULE

(75) Inventors: Toshiyuki Kitagawa, Uji (JP); Tatehiko Inoue, Hirakata (JP); Isao Masumoto, Jyoto (JP); Koji Tsuyuki, Tuzuki-gun (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/341,561

(22) Filed: Jan. 14, 2003

(65) Prior Publication Data

US 2003/0133251 A1 Jul. 17, 2003

(30) Foreign Application Priority Data

Jan. 16, 2002 (JP) ........................................ 2002-006898

(51) Int. Cl.$^7$ ................................................. H01G 4/38
(52) U.S. Cl. ....................... 361/328; 361/763; 361/809; 361/811
(58) Field of Search .................................. 361/763, 766, 361/809, 810, 811, 728, 328, 301.3, 541

(56) References Cited

U.S. PATENT DOCUMENTS

| | | | | |
|---|---|---|---|---|
| 4,124,876 A | * | 11/1978 | Labadie et al. | 361/325 |
| 5,875,091 A | * | 2/1999 | Rieken | 361/328 |
| 5,940,263 A | * | 8/1999 | Jakoubovitch | 361/328 |
| 6,058,004 A | * | 5/2000 | Duva et al. | 361/301.4 |

* cited by examiner

*Primary Examiner*—Anthony Dinkins
(74) *Attorney, Agent, or Firm*—Parkhurst & Wendel, L.L.P.

(57) ABSTRACT

A reliable capacitor module is provided which can solve the following problem: when a plurality of capacitors is mounted on a wiring board, the wiring board is distorted and deformed by the weight and cracks appear on mounting holes and the main body of the wiring board. The bottoms of metallic cases of the capacitors are fit in recesses formed on a mounting plate. In this state, lead wires drawn from the upper surfaces of the capacitors are electrically connected via the wiring board. With this configuration, a weight load of the plurality of capacitors is not applied at all, thereby preventing distortion and deformation of the wiring board and vibration causing cracks on the main body of the wiring board.

7 Claims, 8 Drawing Sheets

CAPACITOR MODULE

FIELD OF THE INVENTION

The present invention relates to a capacitor module in which a plurality of capacitors is mounted on a wiring board.

BACKGROUND OF THE INVENTION

Figure 9:
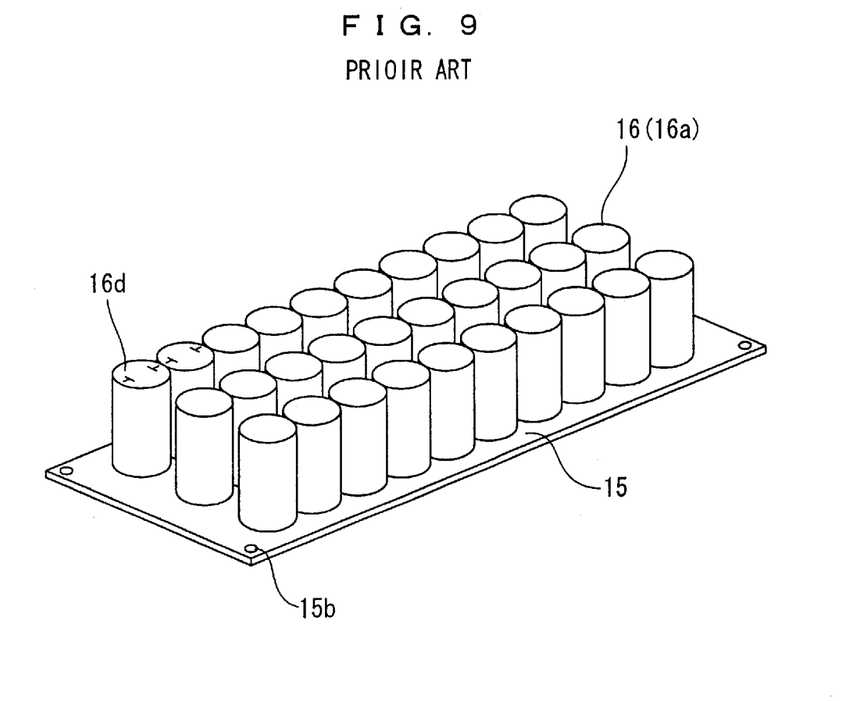
FIG. 9 is a perspective view showing a configuration of a conventional capacitor module.
Figure 10:
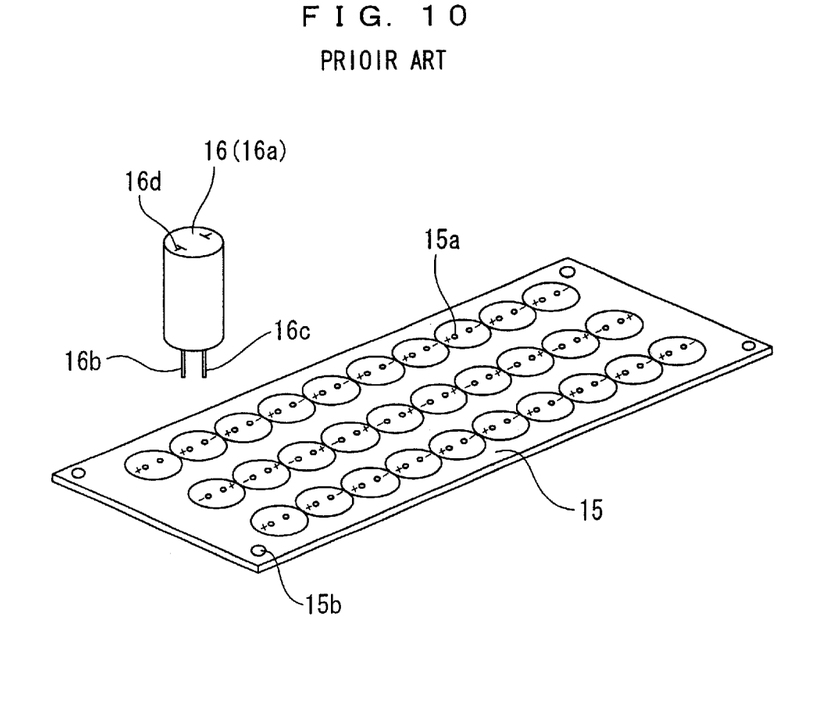
FIG. 10 is a perspective view showing a wiring board used for the capacitor module.

FIG. 9 is a perspective view showing the configuration of such a conventional capacitor module. FIG. 10 is a perspective view showing a wiring board used for the capacitor module. In FIGS. 9 and 10, reference numeral 15 denotes a wiring board, reference numeral 15a denotes mounting holes for inserting lead wires 16b and 16c of capacitors 16 provided on the wiring board 15, and reference numeral 15b denotes mounting holes which are formed on the wiring board 15 to mount the capacitor module into equipment to be used. Reference numeral 16 denotes capacitors. The capacitor 16 contains a capacitor element having an electrolytic solution within a metallic case 16a in a cylinder shape with a bottom (both of the case and the element are not shown), and the pair of lead wires 16b and 16c for external connection is drawn from the capacitor element.

The conventional capacitor module in such an arrangement is configured, by fitting the pairs of the lead wires 16b and 16c of the capacitors 16 in the mounting holes 15a provided on the wiring board 15, before the lead wires 16b and 16c are soldered on the back so as to be electrically connected to wiring circuits (not shown) provided on the wiring board 15, and the plurality of capacitors 16 is mounted on the single wiring board 15.

Besides, for example, Patent Document 1 (Japanese Patent Laid-Open No. 6-275471) has been known as prior art document information.

In the above conventional capacitor module, such a capacitor module is mounted on equipment to be used via the mounting holes 15b provided on the wiring board 15 for use. In some mounting conditions, however, the weight of the plurality of capacitors 16 (several hundreds grams to several kilograms) is applied onto the single wiring board 15, resulting in distortion and deformation in the wiring board 15. Further, in some working conditions, particularly when vibration occurs, breaks appear on the mounting holes 15b of the wiring board 15 and the main body of the wiring board 15 or cracks appear on soldered parts which electrically connect the pair of lead wires 16b and 16c of the capacitors 16 to the wiring circuits provided on the wiring board 15.

Moreover, when abnormal current passes through the capacitor 16, an explosion-proof valve 16d is operated which is provided on the metallic case 16a of the capacitor 16, and the driving electrolytic solution that is filled in the capacitor element contained within the metallic case 16a is discharged from the explosion-proof valve 16d. Since the discharged electrolytic solution for driving is scattered to surrounding parts, a short circuit occurs and another adjacent electronic equipment similarly develops a short circuit in the worst case.

The present invention has as its objective the provision of a reliable capacitor module which can solve such conventional problems, eliminate a weight load applied onto a wiring board, and prevent the occurrence of short circuits even when an explosion-proof valve is operated.

SUMMARY OF THE INVENTION

In order to solve the above-described problems, a first embodiment of the present invention is constituted by a mounting plate having a plurality of first recesses formed on the upper surface thereof, a plurality of capacitors at least partially held in the first recesses of the mounting plate, and a wiring board electrically connected with lead wires drawn from each capacitor, the mounting plate and the wiring board being opposed to each other via the capacitors, the mounting plate being devised for mounting the capacitor module into an equipment for use. With this configuration, the weight of the plurality of capacitors is totally supported by the mounting plate. Hence, it is possible to eliminate a weight load applied onto the wiring board and prevent the occurrence of a break on the wiring board, thereby providing a reliable capacitor module.

Further, the present invention further comprises second recesses formed in the plurality of first recesses on the upper surface of the mounting plate, the second recesses being smaller in diameter than the first recesses. With this configuration, even when an explosion-proof valve provided on the bottom of the case of the capacitor is operated to discharge an electrolytic solution for driving, the discharged electrolytic solution for driving is well stored in the second recess and is not scattered to the outside. Thus, short circuits do not occur and a reliable capacitor module can be provided.

As described above, in the capacitor module according to the first embodiment of the present invention, the bottoms of the metallic cases of the capacitors are fit and held in the first recesses formed on the mounting plate, the lead wires drawn from the upper surface of each capacitor are electrically connected via the wiring board in this state. Since the mounting plate mechanically fixes the plurality of capacitors, a weight load of the plurality of capacitors is not applied onto the wiring board. Therefore, it is possible to completely prevent the wiring board from being distorted or deformed by the weight load of the plurality of capacitors, prevent vibration from breaking the main body of the wiring board, and prevent a crack on a soldered part between the lead wires of the capacitor and the wiring board.

Next, according to a second embodiment of the present invention, amounting plate is constituted by a holding member and a main body, the holding member having a plurality of holes for holding capacitors and being fit in the main body. With this configuration, even when the used capacitors are changed, it is possible to respond to the change just by changing the holding member, thereby reducing the total cost.

Further, the present invention is configured such that ribs and/or slits are provided in each hole of the holding member constituting the mounting plate. With this configuration, it is possible to more positively hold the capacitors and remarkably improve holding force.

Moreover, the present invention is configured such that the main body constituting the mounting plate has storage recesses for storing electronic components other than capacitors. With this configuration, it is possible to integrally mount a control circuit and so on to achieve a multi-function capacitor module.

Additionally, a forming part formed by bending a lead wire is provided between the main body of the capacitor and a wiring board insertion part of the lead wire drawn from the capacitors. With this configuration, it is possible to maintain a fixed distance between the main body of the capacitor and the wiring board, thereby reducing heat stress applied to the lead wire.

As described above, in the capacitor module according to the second embodiment of the present invention, the second recesses are provided in the first recesses of the mounting plate. Hence, even in the case where an explosion-proof valve is operated to discharge an electrolytic solution for driving when abnormal current passes though the capacitors, the discharged electrolytic solution for driving is well stored in the second recesses provided in the first recesses of the mounting plate and is not scattered to the surrounding parts, thereby preventing the occurrence of short circuits.

DESCRIPTION OF THE EMBODIMENTS (Embodiment 1)

Figure 1:
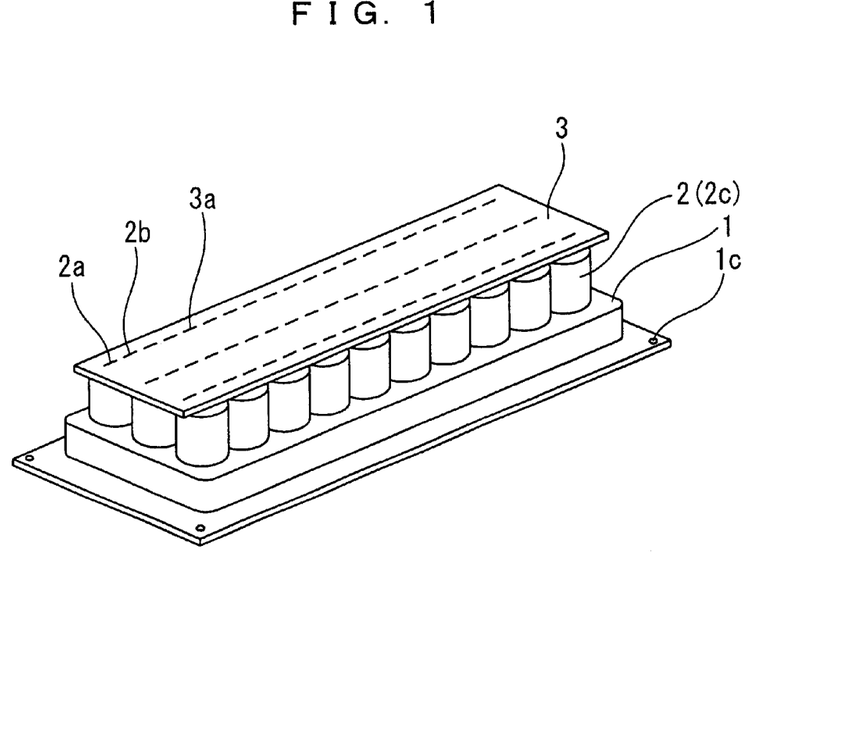
FIG. 1 is a perspective view showing a configuration of a capacitor module according to Embodiment 1 of the present invention.
Figure 2:
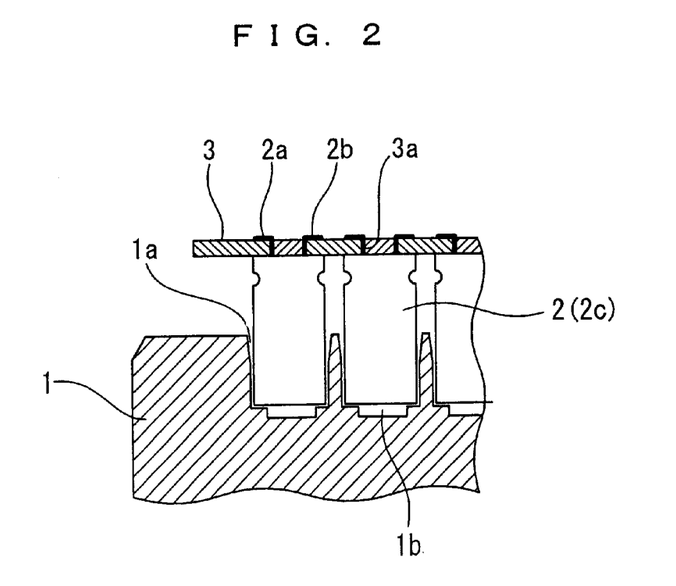
FIG. 2 is a sectional view showing a main part of FIG. 1.
Figure 3A:
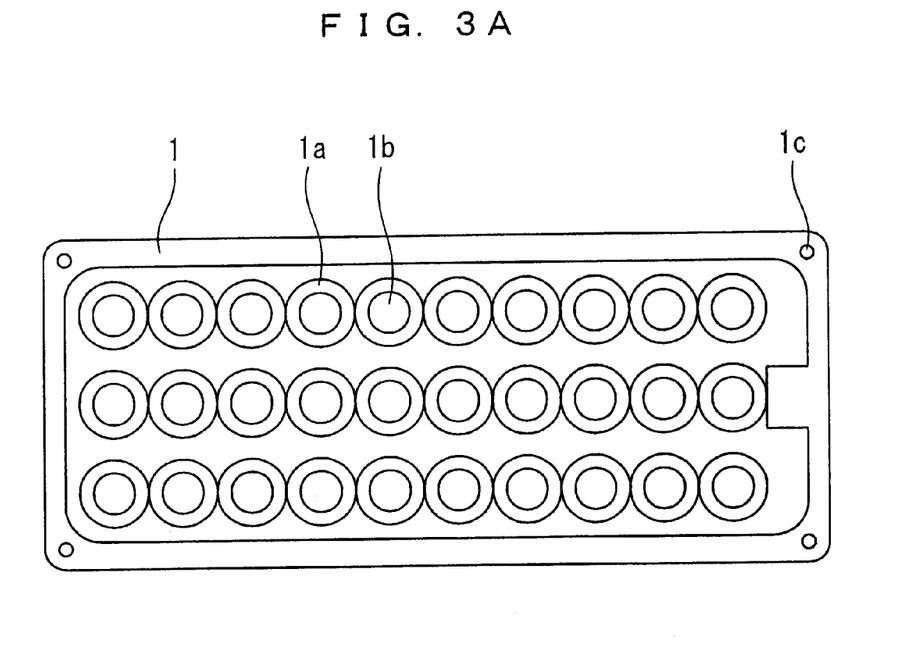
FIG. 3A is a plan view showing a mounting plate used for the capacitor module and FIG. 3B is a sectional view showing the same.
Figure 3B:
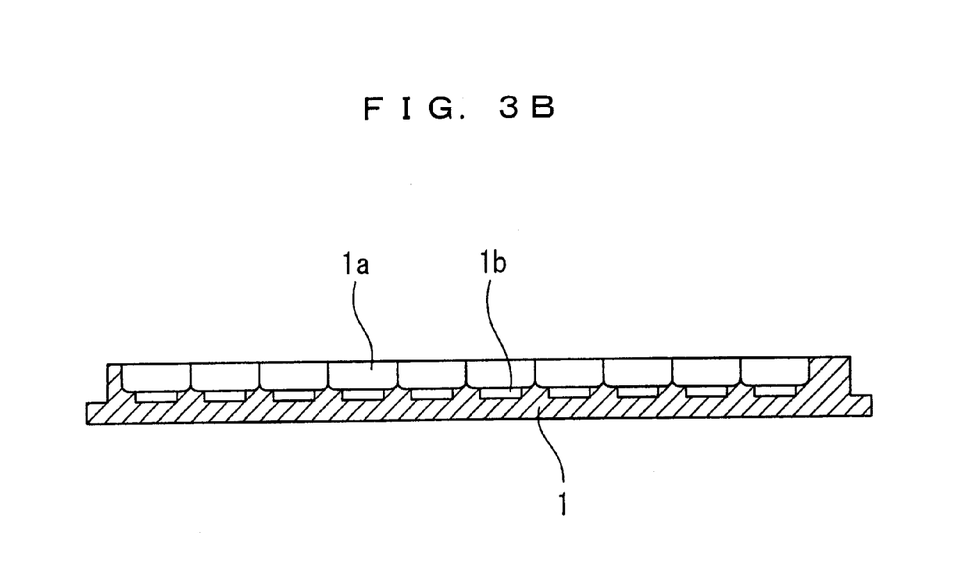
Figure 4:
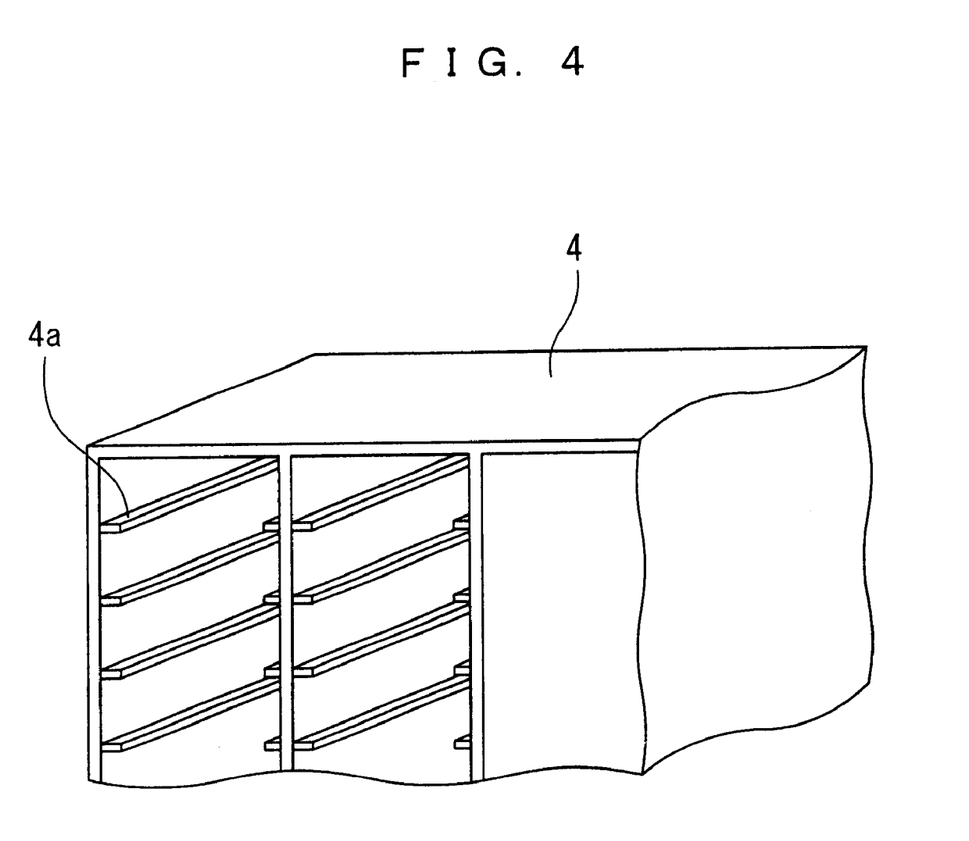
FIG. 4 is a perspective view showing a main part of an equipment in which the capacitor module is used.

FIG. 1 is a perspective view showing the configuration of a capacitor module according to Embodiment 1 of the present invention. FIG. 2 is a sectional view showing a main part of FIG. 1. FIGS. 3A and 3B are a plan view and a sectional view that show a mounting plate used for the capacitor module. FIG. 4 is a perspective view showing a main part of equipment to be used in which the capacitor module is mounted.

In FIGS. 1 to 4, reference numeral 1 denotes-the mounting plate formed by resin molding, and reference numeral 2 denotes capacitors, each comprising a pair of lead wires 2a and 2b for external connection. The mounting plate 1 has a plurality of recesses 1a where the bottoms of metallic cases 2c of the capacitors 2 are partially fit, second recesses 1b smaller than the recesses 1a in diameter are respectively provided in the recesses 1a, and mounting holes 1c for the equipment to be used are provided on the corners. Reference numeral 3 denotes a wiring board which has a plurality of mounting holes 3a where the pairs of lead wires 2a and 2b for external connection are inserted. The lead wires 2a and 2b are drawn from a capacitor element (not shown) stored in the metallic case 2c of the capacitor 2.

The capacitor module according to Embodiment 1 is configured such that the bottoms of the metallic cases 2c of the capacitors 2 are fit in the recesses 1a provided on the mounting plate 1, the pairs of lead wires 2a and 2b drawn from the upper surfaces of the capacitors 2 are inserted into the mounting holes 3a in this state, the mounting holes 3a being provided on the wiring board 3, the lead wires 2a and 2b are bent and soldered on the back of the wiring board 3 (upper surfaces shown in the drawings) so as to make electrical connection with wiring circuits (not shown) provided on the wiring board 3, and the plurality of capacitors 2 is integrated mechanically and electrically via the mounting plate 1 and the wiring board 3.

Besides, as shown in FIG. 4, the above-described capacitor modules according to Embodiment 1 are mounted on mounting parts 4a provided in equipment to be used 4 and are used mainly as banks for a backup power supply for emergency.

Further, in the above-described capacitor module according to Embodiment 1, since the mounting plate 1 mechanically fixes the plurality of capacitors 2, a weight load of the plurality of capacitors 2 is not applied onto the wiring board 3. Thus, unlike the conventional art, it is possible to completely prevent the wiring board 3 from being distorted or deformed by a weight load of the plurality of capacitors 2, prevent vibration from breaking the main body of the wiring board 3, and prevent a crack on a soldered part between the lead wires 2a and 2b of the capacitor 2 and the wiring board 3.

Moreover, even in the case where an explosion-proof valve is operated to discharge an electrolytic solution for driving when abnormal current passes though the capacitors 2, the discharged electrolytic solution for driving is just stored in the second recesses 1b provided in the recesses 1a of the mounting plate 1 but is not scattered to the surrounding parts. Hence, it is possible to eliminate the occurrence of short circuits.

Additionally, resistors other than the capacitors 2 and electronic components such as a switch are connected to the wiring board 3, thereby achieving a multi-function capacitor module.

(Embodiment 2)

Figure 5A:
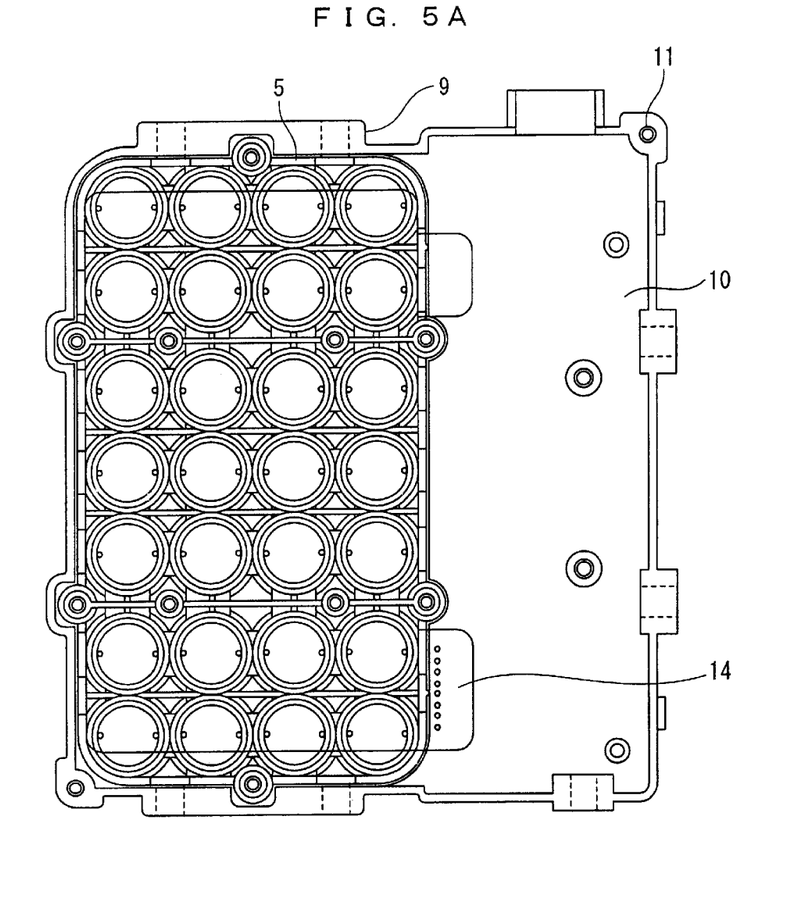
FIG. 5A is a plan view showing a configuration of a capacitor module according to Embodiment 2 of the present invention and FIG. 5B is a front sectional view showing the same.
Figure 5B:
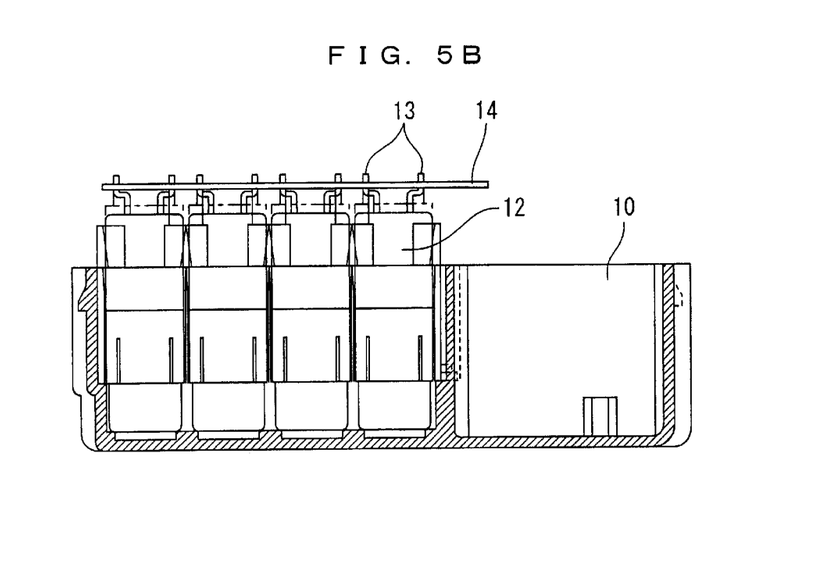
Figure 6A:
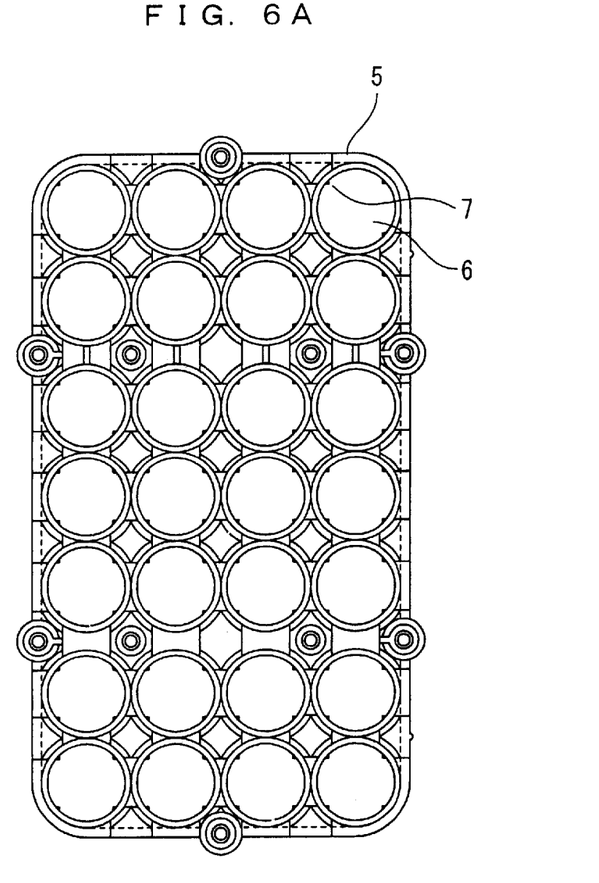
FIG. 6A is a plan view showing a holding member constituting the capacitor module and FIG. 6B is a front sectional view showing the same.
Figure 6B:
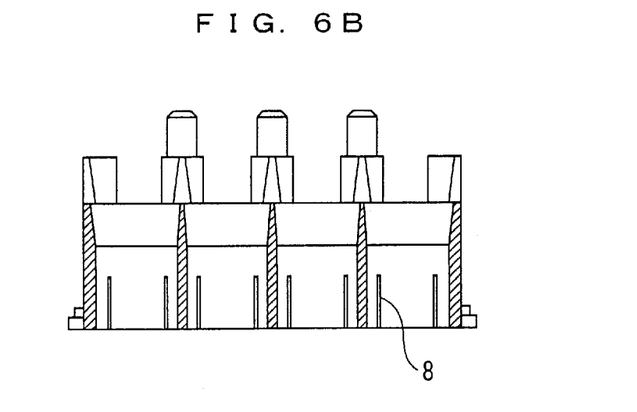
Figure 7A:
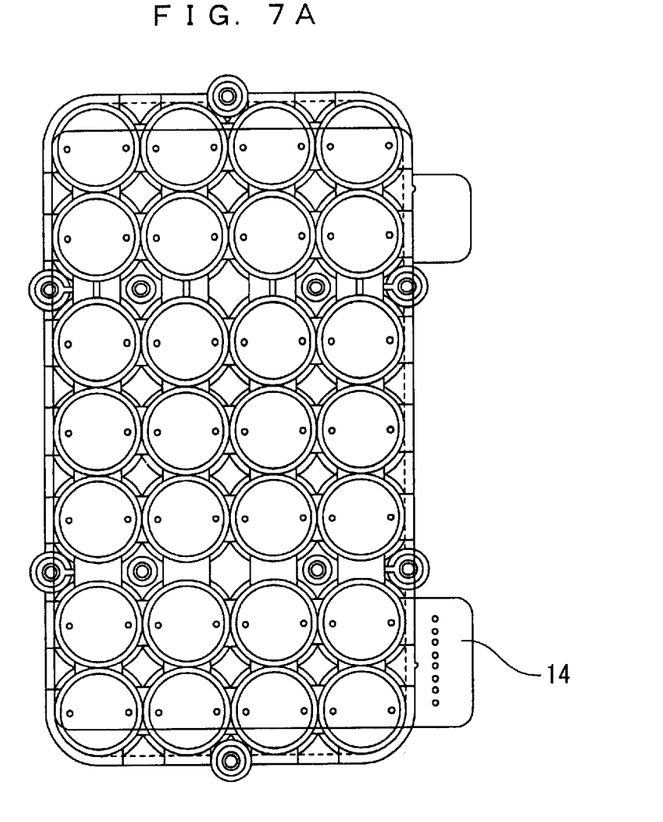
FIG. 7A is a plan view showing a state in which capacitors are held by the holding member and FIG. 7B is a front sectional view showing the same.
Figure 7B:
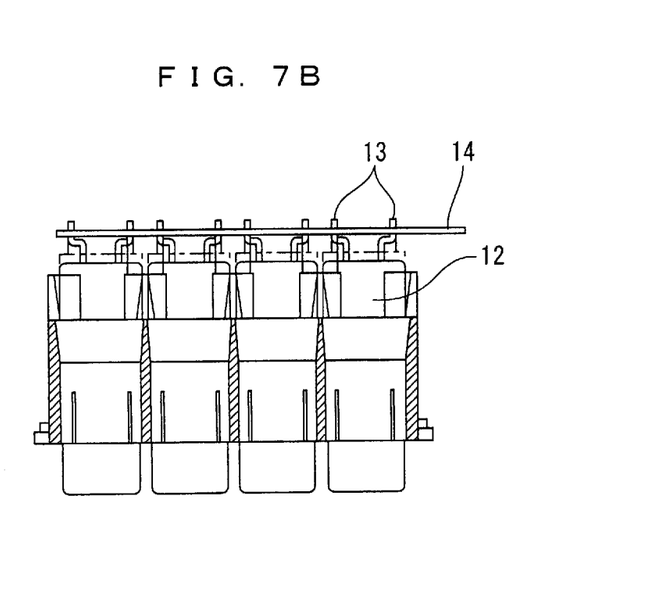
Figure 8:
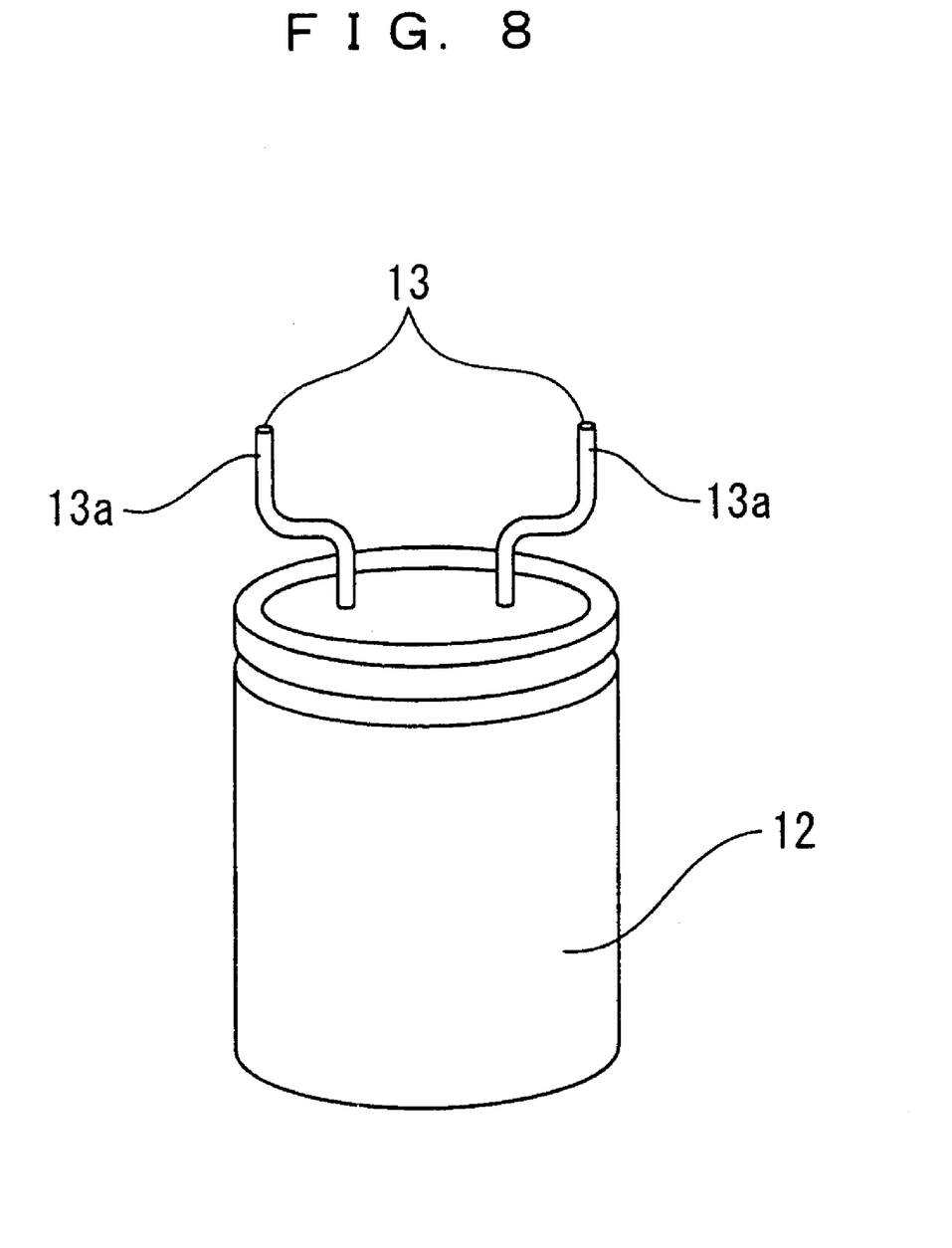
FIG. 8 is a perspective view showing the capacitor used for the capacitor module.

FIGS. 5A and 5B are a plan view and a front sectional view showing the configuration of a capacitor module according to Embodiment 2 of the present invention. FIGS. 6A and 6B are a plan view and a front sectional view that show a holding member constituting the capacitor module. FIGS. 7A and 7B are a plan view and a front sectional view that show a state in which capacitors are held by the holding member. FIG. 8 is a perspective view showing the capacitor used in the capacitor module.

In FIGS. 5 to 8, reference numeral 5 denotes a holding member formed by resin molding. The holding member 5 comprises a plurality of holes 6 for holding the capacitors, and ribs 7 and slits 8 are provided in the holes 6. Reference numeral 9 denotes a main body which is similarly formed by resin molding. The holding member 5 is detachably fit in the main body 9, which comprises a storage recess 10 for integrally storing a control circuit for controlling the capacitor module, and a mounting part 11 for mounting the capacitor module to equipment to be used. Reference numeral 12 denotes capacitors. Lead wires 13 on the capacitors 12 have forming parts 13a which are bent between a wiring board insertion part (discussed later) and the main body of the capacitor. Reference numeral 14 denotes a wiring board where the lead wires 13 drawn from the capacitors 12 are connected.

Further, the capacitor module configured thus is assembled such that the plurality of capacitors 12 is inserted and held in the holes 6 provided on the holding member 5, the lead wires 13 drawn from the capacitors 12 are connected in this state by inserting the lead wires 13 into mounting holes provided on the wiring board 14 and soldering the holes therein, and then, the holding member 5 is fit in the main body 9.

In the above-described capacitor module according to Embodiment 2, the mounting plate 1 discussed in Embodiment 1 is divided into the holding member 5 and the main body 9. Hence, even when the used capacitors 12 are changed, it is possible to respond to the change only by changing the holding member 5, thereby reducing the total cost. In addition, it is possible to provide the ribs 7 and the slits 8 in the holes for holding the capacitors 12 by permitting the holding member 5 to be independent, and thus the ribs 7 and the slits 8 remarkably improve holding force for holding the capacitors 12.

Further, the storage recesses 10 are integrally provided on the main body 9, so that a control circuit and so on for controlling the capacitor module can be integrally mounted, thereby achieving a smaller and multi-function capacitor module.

What is claimed is:

1. A capacitor module, comprising:

a mounting plate having a plurality of first recesses formed on an upper surface thereof;

a plurality of capacitors each at least partially held in one of the first recesses; and a wiring board electrically connected to the plurality of capacitors, the mounting plate and the wiring board being opposed to each other with the capacitors interposed between the plate and the board, the mounting plate for mounting the capacitor module into an equipment.

2. The capacitor module according to claim 1, wherein each of the first recesses on the surface of the mounting plate has a second recess having a smaller diameter than that of the first recesses.

3. The capacitor module according to claim 1, wherein the mounting plate comprises a holding member and a main body, the holding member having a plurality of holes for holding capacitors and located in the main body.

4. The capacitor module according to claim 3, wherein each of the holes of the holding member further comprises ribs and slits.

5. The capacitor module according to claim 3, wherein the main body comprises a storage recess for storing an electronic component other than a capacitor.

6. The capacitor module according to claim 1, further comprising a pair of lead wires connecting each of said capacitors with the wiring board, the lead wires each having a pre-formed portion for insertion into a corresponding mounting hole in the wiring board.

7. The capacitor module according to claim 3, wherein each of the holes of the holding member further comprises slits.

* * * * *